(12) United States Patent
Chang (10) Patent No.: US 6,562,144 B2
(45) Date of Patent: May 13, 2003

(54) WAFER CLEANING METHOD

(75) Inventor: Ching-Yu Chang, I-Lan Hsien (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 09/871,664

(22) Filed: Jun. 4, 2001

(65) Prior Publication Data

US 2001/0050092 A1 Dec. 13, 2001

(30) Foreign Application Priority Data

Jun. 9, 2000 (TW) ........................................ 89111236 A (51) Int. Cl.⁷ ............................... B08B 3/08; B08B 5/04
(52) U.S. Cl. ............................... 134/21; 134/3; 134/18; 134/26; 134/28; 134/30; 134/902
(58) Field of Search ............................... 134/3, 21, 26, 134/28, 30, 902, 18

(56) References Cited

U.S. PATENT DOCUMENTS

| 5,188,136 A | * | 2/1993 | Kumagai ...................... 134/66 |
| 6,240,933 B1 | * | 6/2001 | Bergman ..................... 134/1.3 |
| 6,286,231 B1 | * | 9/2001 | Bergman et al. .............. 34/410 |

* cited by examiner

Primary Examiner—Zeinab El-Arini
(74) Attorney, Agent, or Firm—Winston Hsu (57) ABSTRACT

A method is provided for cleaning a surface of a wafer. First, the wafer is placed in a closed cleaning chamber, and then a cleaning agent is infused into the cleaning chamber to a predetermined height, so that the wafer is completely immersed in the cleaning agent. Next, the pressure in the cleaning chamber is lowered to a sub-atmospheric state of 0.1 to 0.5 atm with a vacuum pump, and then returned to the normal value to complete the cleaning process.

14 Claims, 7 Drawing Sheets

WAFER CLEANING METHOD

BACKGROUND OF THE INVENTION

1. Field of the Invention.

The present invention provides a method for cleaning a surface of a silicon wafer, and more particularly, a method for cleaning the surface of a wafer with a line width below 0.15 micrometers.

2. Description of the Prior Art

In integrated circuit fabrication processes, a wafer has to repeatedly go through various chemical processes, such as chemical vapor deposition (CVD), dry etch, or chemical mechanical polishing (CMP), etc., which leave contaminating particles on a surface of the wafer. Moreover, a surface of the substrate is easily oxidized and forms a native oxide layer, which effects quality of the wafer product. For these reasons, a wafer has to be cleaned several times during processing in order to remove the contaminates and the native oxide layer, so as to maintain surface cleanliness.

In general, there are two types of cleaning methods, dry and wet. The wet cleaning method is used more frequently. The wet cleaning method employs an RCA cleaning technique, which makes use of the following solutions:

1) RCA Standard Clean 1 (SC-1), which can remove the micro-particles left on the surface of a wafer to be cleaned, and is made of one part $NH_4OH$, one part $H_2O_2$, and five parts $H_2O$, and in which the wafer is immersed for 5 minutes at 70° C.
2) RCA Standard Clean II (SC-2), which can remove the metallic particles left on a wafer's surface, and is made of one part HCl, one part $H_2O_2$, and six parts $H_2O$, and in which the wafer is immersed for 5 to 10 minutes at 70° C.
3) Piranha (SPM), which can remove the organic particles from the surface of the wafer, is made of five parts $H_2SO_4$ and one part $H_2O_2$, and in which the wafer is immersed for 10 to 15 minutes at 120° C.; and
4) Diluted hydrofluoric acid clean (DHF), which is used to remove the silicon dioxide layer from the surface of the wafer, and is made of one part HF and fifty parts $H_2O$, and in which the wafer is immersed for 10 to 30 seconds at room temperature.

Recently, in order to save cleaning agents and improve cleaning quality, other cleaning agents than the above mentioned have been developed. For example, an $O_3/H_2O$ solution which, being a good oxidizing agent, can remove organic particles and metallic particles at room temperature, is developed to replace SPM, which works well only at the temperature above 120° C. Moreover, surfactant and ultrasonic oscillation techniques are often used with the conventional cleaning processes, so as to achieve optimal cleaning results.

Figure 1:
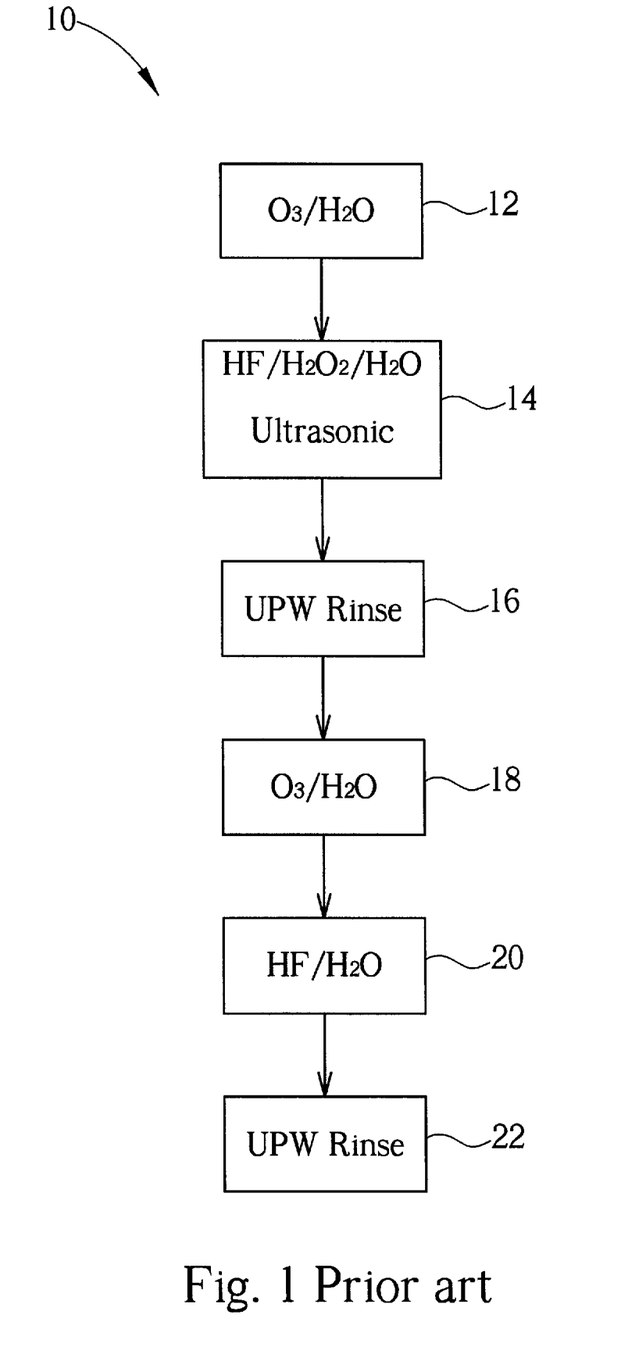
FIG. 1 is a flow chart of cleaning processes for cleaning a surface of a wafer at room temperature according to the prior art.

Please refer to FIG. 1. FIG. 1 is a flow chart of a cleaning process 10 for cleaning wafers at room temperature according to the prior art. As shown here, the cleaning process 10 comprises the following steps:

Step 12: Immersing the wafer to be cleaned in a solution of $O_3$ in water ($O_3/H_2O$), as $O_3$ is a good oxidizing agent, to remove hydrocarbons, other organic particles, and inactive metallic ions, such as Au and Ag.

Step 14: Immersing the wafer in an $HF/H_2O_2$ solution to remove metallic ions and a native oxide layer, and, after reducing adhesiveness of the micro-particles to the surface of the wafer with a surface activator, employing the ultrasonic oscillating technique to remove the loosened particles.

Step 16: Cleaning the surface of the wafer with ultra-pure water (UPW) to remove remaining inorganic particles left on the surface of the wafer after Step 14.

Step 18: Immersing the wafer in a solution of $O_3$ in water to remove the surface activator left on the surface of the wafer resulting from step 14.

Step 20: Using DHF solution to remove from the surface of the wafer the native oxide layer resulting from Step 18.

Step 22: Using UPW to clean the surface of the wafer.

Because of demand on the density of devices on the wafer, and with the development of photo printing techniques, the widths of contact holes, vias or trenches on the surface of a wafer are getting smaller, and the aspect ratios are getting larger. For example, a contact hole 0.15 mm in width with an aspect ratio of 10 would have a depth of 1.5 mm. For this reason, the cleaning agents can not easily reach the bottom of the contact hole under capillary attraction, resulting in a reduction in cleaning efficiency, affecting the rest of the manufacturing process, and ultimately the quality of the final product.

Figure 2:
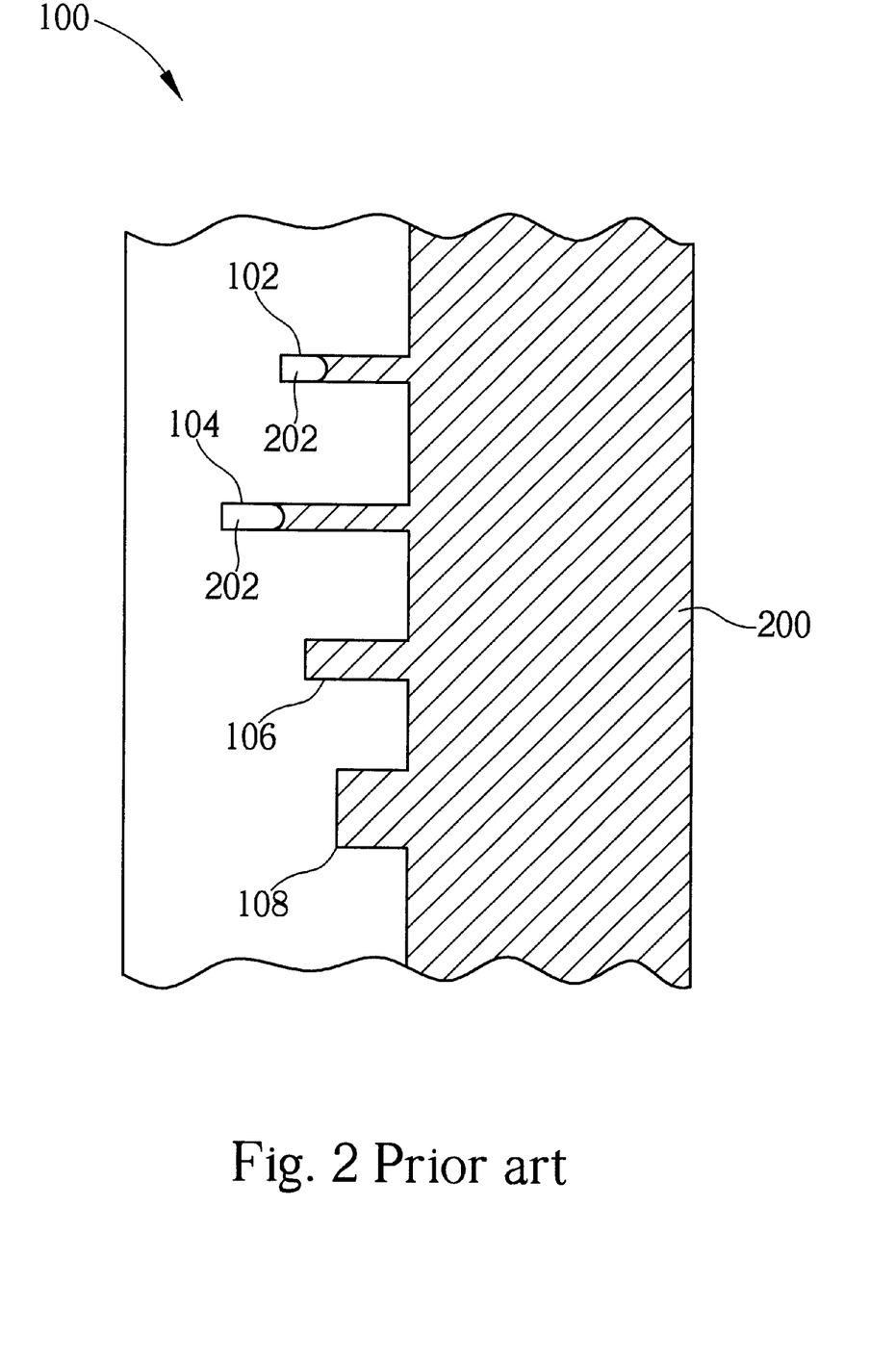
FIG. 2 is a cross-sectional view of the surface of the wafer in the conventional cleaning processes.

Please refer to FIG. 2. FIG. 2 is a cross-sectional view of a wafer 100 undergoing the cleaning processes. As shown, the wafer 100 is immersed in a cleaning agent 200, and the surface of the wafer 100 comprises a contact hole 102 of width 0.15 mm, a contact hole 104 of width 0.18 mm, a contact hole 106 of width 0.3 mm, and a contact hole 108 of width 0.5 mm, wherein their aspect ratios are 6, 10, 3 and 1, respectively. Unlike the contact holes 106 and 108, the contact holes 102 and 104 have widths less than 0.2 mm, so air chambers 202, due to capillarity, are formed at the bottoms of the contact holes 102 and 104, and prevent the cleaning agent 200 from reaching the bottoms of the contact holes 102 and 104, reducing the cleaning efficiency for the wafer 100.

SUMMARY OF THE INVENTION

The main purpose of the present invention is to provide a cleaning method for cleaning a surface of a wafer comprising contact holes, a via, or trenches less than 0.2 mm in width.

In this method, a wafer is placed in a closed cleaning chamber, and then the cleaning agent is poured into the cleaning chamber to a predetermined height, so that the wafer is completely immersed in the cleaning agent. Then, the pressure in the cleaning chamber is lowered to a sub-atmospheric state—between 0.1 and 0.9 atm. To finish, the pressure is returned to a normal value. The cleaning agent can be dilute hydrofluoric acid (DHF), ultra-pure water (UPW), RCA standard clean 1 (SC-1), RCA standard clean 2 (SC-2), a solution of $O_3$ in water ($O_3/H_2O$), a solution of HF in $H_2O_2$, buffered oxide etchant (BOE), or a hot phosphoric acid solution.

In the present invention, because the pressure in the cleaning chamber is lowered to a sub-atmospheric state in a few seconds, the cleaning agent can thoroughly clean the surface of a wafer that has contact holes or trenches with large aspect ratios, resulting in a good cleaning quality. Also, since the contact holes with large aspect ratios can be wetted in a very short period of time, the cleaning and etching times can be precisely controlled.

These and other objectives of the present invention will no doubt become obvious to those of ordinary skill in the art after having read the following detailed description of the preferred embodiment that is illustrated in the various figures and drawings.

DETAILED DESCRIPTION OF THE PRESENT INVENTION

Figure 3:
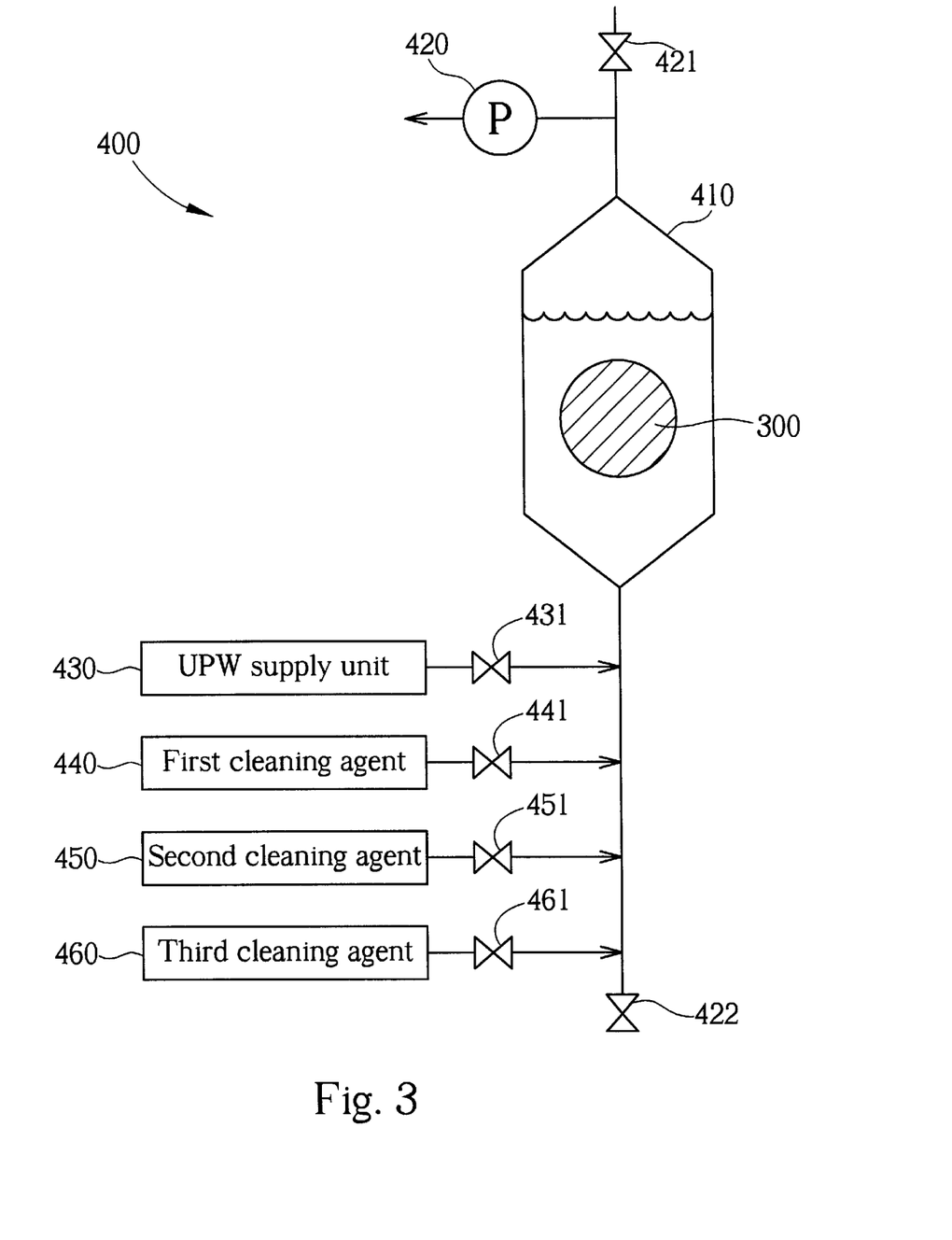
FIG. 3 is a view of a cleaning apparatus of a wafer according to the present invention.

Please refer to FIG. 3. FIG. 3 is a view of a cleaning apparatus 400 for a wafer 300 according to the present invention. As shown here, the cleaning apparatus 400 comprises a cleaning chamber 410, a vacuum pump 420, a UPW supply unit 430, cleaning agent supply units 440, 450 and 460, a vent valve 421, an escape valve 422, and control valves 431, 441, 451, and 461. The wafer 300 is placed in the cleaning chamber 410; the vacuum pump 420 is used to lower the pressure in the cleaning chamber 410 to between 0.1 and 0.9 atm in 2 to 5 seconds.

The control valves 431, 441, 451, and 461 are used to control timing and flows of the UPW supply unit 430, and cleaning agent supply units 440, 450 and 460 into the cleaning chamber 410. The escape valve is used to empty the used cleaning agent from the cleaning chamber 410. In the preferred embodiment of the present invention, the cleaning agent supplied by the cleaning agent supply unit 440 is a solution of $O_3$ in water ($O_3/H_2O$), the cleaning agent supplied by the cleaning agent supply unit 450 is a solution of $HF/H_2O_2$, and the cleaning agent supplied by the cleaning agent supply unit 460 is a DHF solution.

Figure 4:
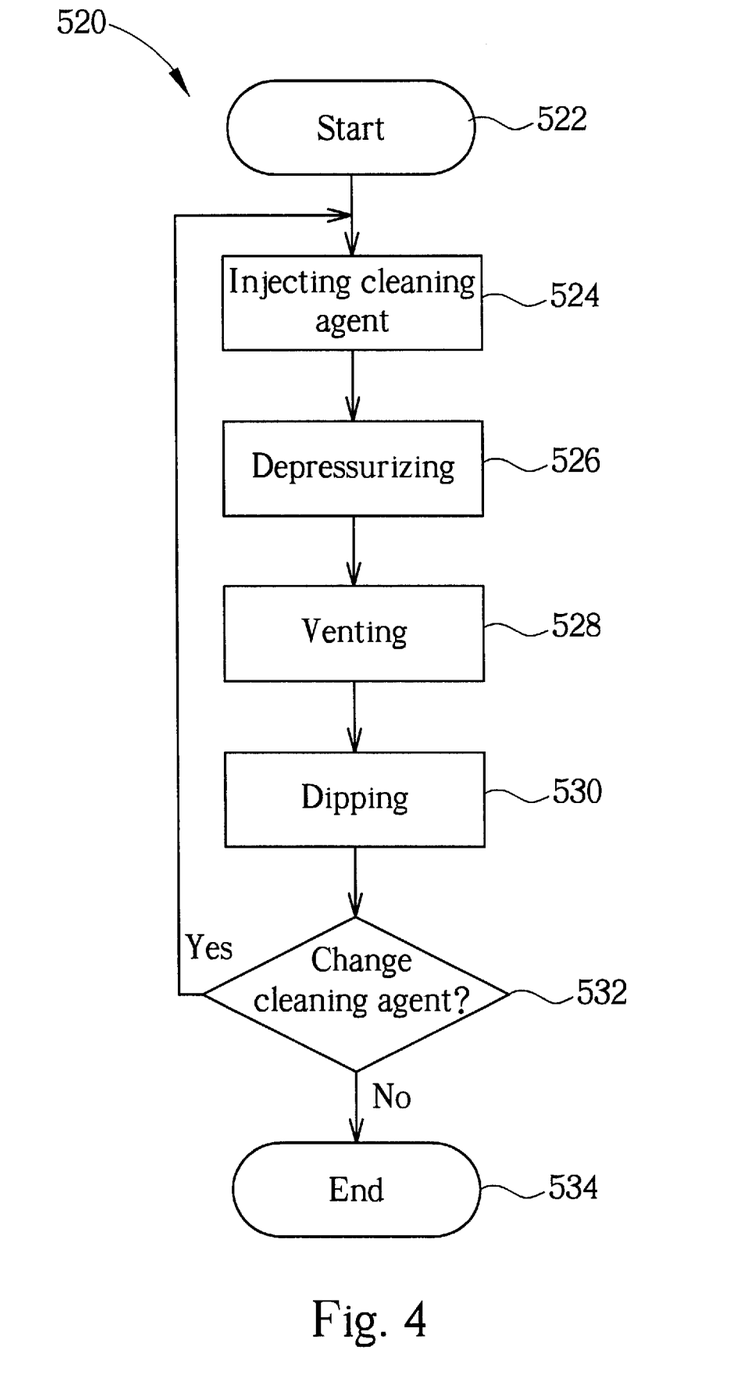
FIG. 4 is a flow chart of a cleaning process for cleaning a surface of the wafer according to the present invention.

Please refer to FIG. 4. FIG. 4 is a flowchart of a cleaning process 520 using the cleaning apparatus 400 to clean the wafer 300 in FIG. 3. As shown here, the cleaning process 520 includes the following steps:

Step 522: Placing the wafer 300 in the cleaning chamber 410.

Step 524: Instilling the cleaning agents into the cleaning chamber 410 to a certain height so as to immerse the wafer completely in the cleaning agent.

Step 526: Decompressing the cleaning chamber 410 to 0.5 atm in 3 second by means of the vacuum pump 420.

Step 528: Opening the venting valve 421 so as to boost the pressure to the normal value.

Step 530: Immersing the wafer 300 in the cleaning agent for a certain period of time.

Step 532: Deciding whether the cleaning agent in the cleaning chamber 410 should be replaced. If it should be replaced, repeating Steps 524 to 530; if not, proceeding to step 534.

Step 534: Finishing the cleaning processes for the wafer 300.

Figure 5:
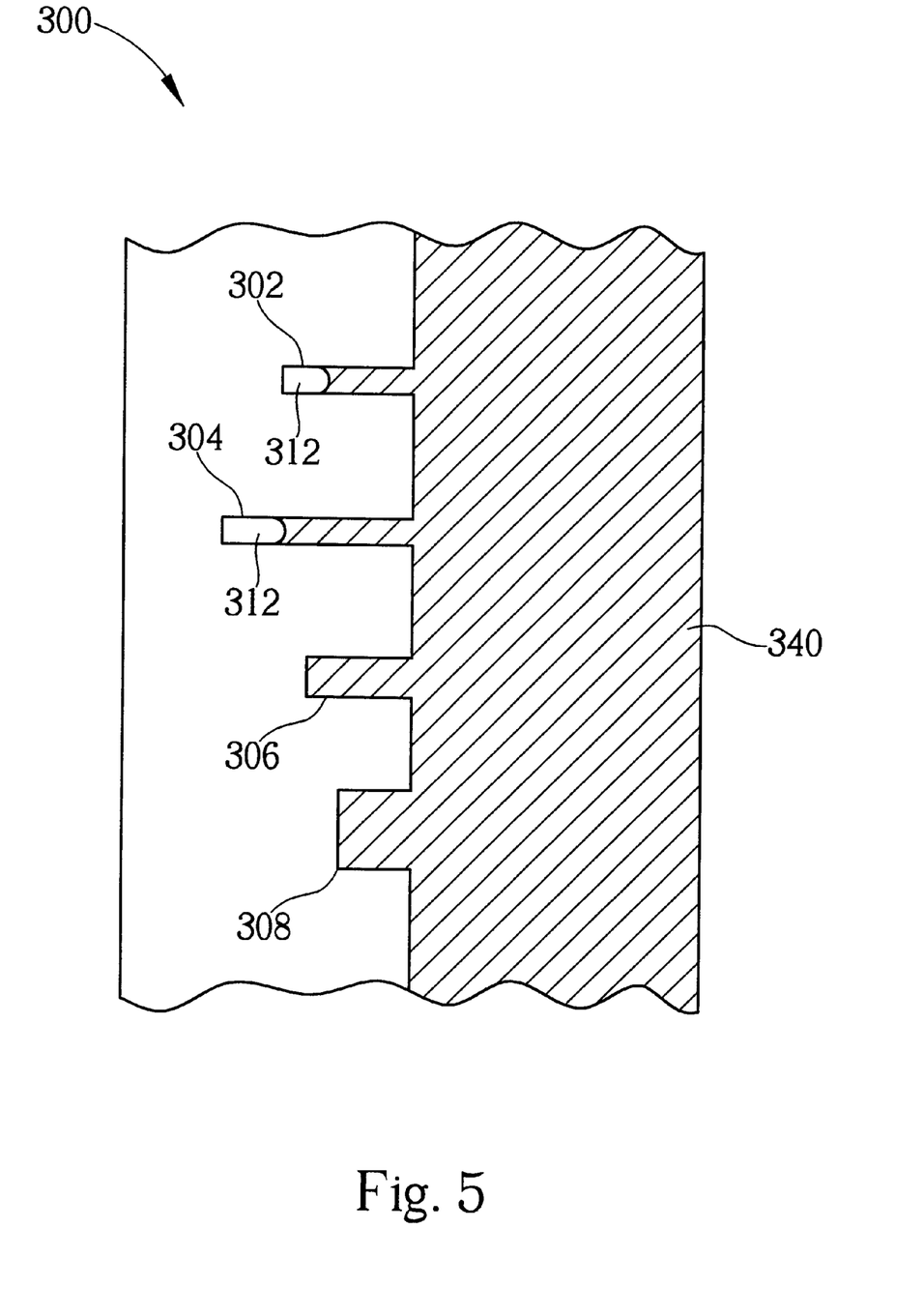
FIGS. 5–7 are cross-sectional views of the surface of the wafer in the cleaning processes according to the present invention.

Please refer to FIG. 5. FIG. 5 is a cross-sectional view of the wafer 300 at Step 524 of the cleaning process 520. As shown here, the surface of the wafer 300 comprises a contact hole 302 0.15 mm in width, a contact hole 304 0.18 mm in width, a contact hole 306 0.3 mm in width, and a contact hole 308 0.5 mm in width, wherein the aspect ratios are 6, 10, 3, and 1, respectively. As the wafer 300 is immersed in the cleaning agent 340, since the widths of the contact holes 302 and 304 are less than 0.2 mm, air chambers 312 form at the bottoms of the contact holes 302 and 304 due to capillarity, preventing the cleaning agent 340 from reaching the bottoms of the contact holes 302 and 304.

Figure 6:
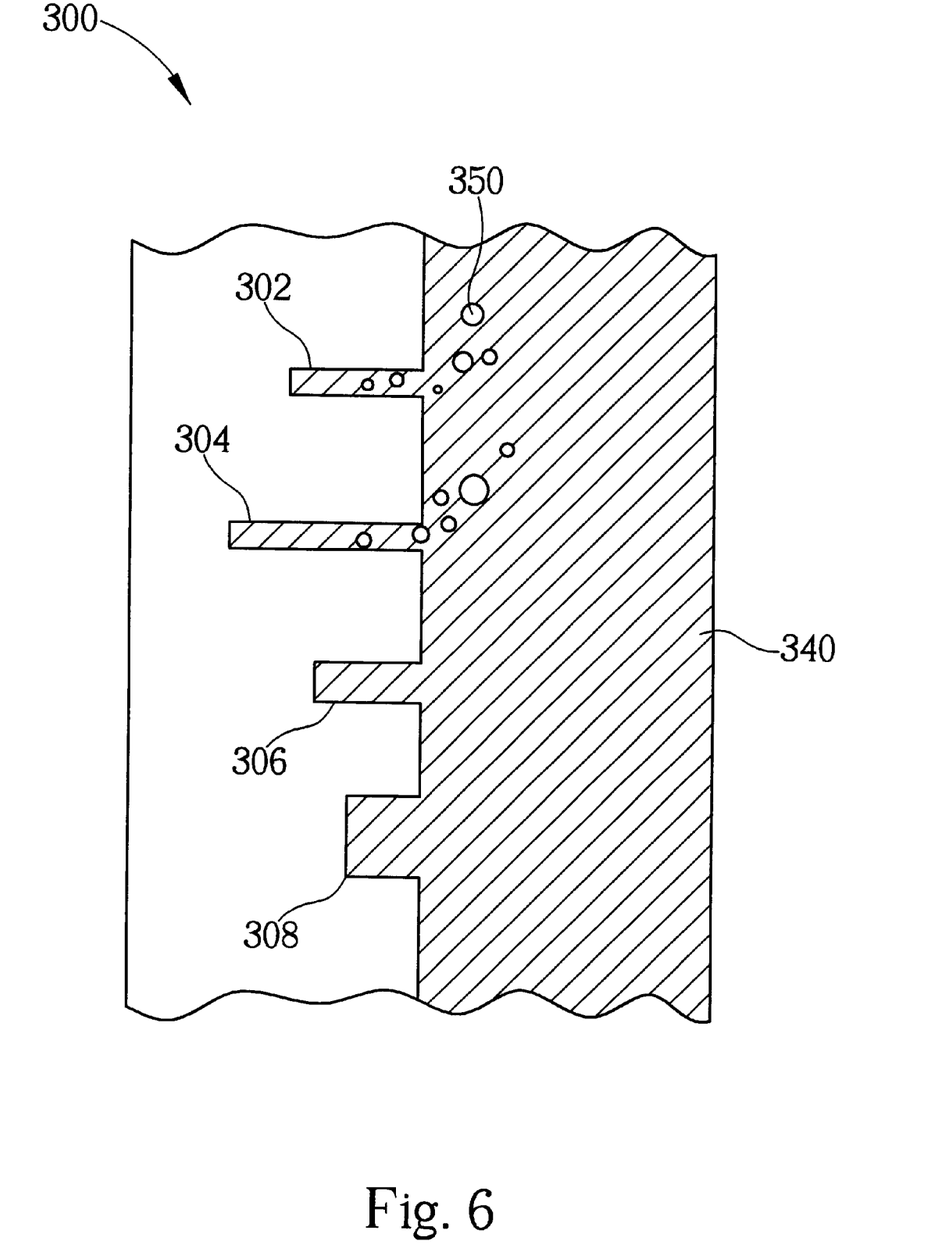
Figure 7:
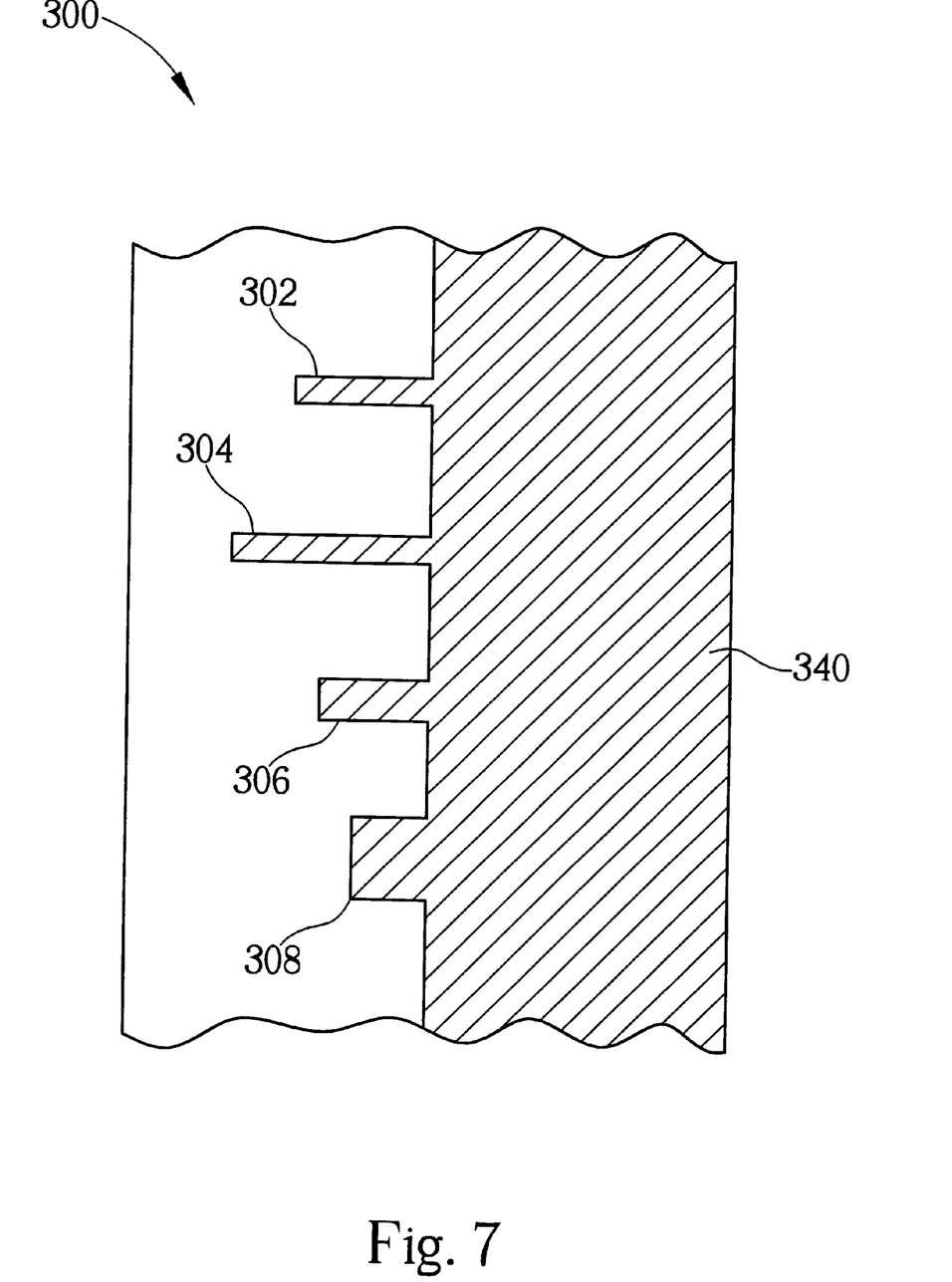

Please refer to FIG. 6. FIG. 6 is a cross sectional view of the wafer 300 at step 526. As shown here, as soon as the pressure in the cleaning chamber 410 is lowered to 0.5 atm, the air in the air chambers 312 breaks into small air bubbles 350, which are then driven by buoyancy and expelled by the cleaning agent 340 from the contact holes 302 and 304. Please refer to FIG. 7. FIG. 7 is a cross-sectional view of the wafer 300 at Step 528. As shown here, before the cleaning chamber 410 is returned to the normal pressure, the small bubbles 350 in the air contact holes have already all escaped, so the cleaning agent 340 completely wets the contact holes 302 and 304, achieving the cleaning and etching purpose. After the pressure in the cleaning chamber 410 returns to the normal value, the wafer 300 is allowed to stay in the cleaning agent for about 10 to 30 seconds, so that the native oxide layer on the surface of the wafer and in the contact holes 302, 304, 306, and 308 can be etched off.

Because the present cleaning method lowers the pressure in the cleaning chamber 410 to a sub-atmospheric state, 0.1 to 0.9 atm, in a few seconds, the air bubbles at the bottoms of the contact holes 302 and 304 are thus expelled, and the cleaning agents can reach the bottoms of these contact holes. However, the cleaning chamber 410 can also at first be in an initial pressure higher than the atmosphere pressure by inputting a high-voltage cleaning agent into the cleaning chamber and then be in an atmosphere pressure by venting the pressure in the cleaning chamber, so as to obtain the effect of decompressing the cleaning chamber. In such a case, the cleaning chamber would not need to be boosted back to the initial pressure to clean the native oxide layer on the wafer.

The cleaning agents 340 that can be used in the present method are DHF solution, UPW, RCA Standard Clean 1 (SC-1), RCA Standard Clean 2 (SC-2), $O_3/H_2O$ solution, $HF/H_2O_2$ solution, BOE or hot phosphoric acid solution. The present method can also be applied for use in post-CMP cleaning processes, or even on any coating process for the surface of the wafer.

In comparison to the prior art method, in the present cleaning method, the quick lowering of the pressure in the cleaning chamber to a sub-atmospheric state efficiently assists the cleaning agent in reaching the contact holes or trenches with large aspect ratios on the surface of the wafer, achieving the purpose of thoroughly cleaning or etching the wafer. Also, by quickly wetting the contact holes with large aspect ratios, the present method efficiently controls the cleaning time and the etching quality, improving the throughput of a manufacturing process of the wafer.

The description above is the preferred embodiment of the present invention. Those skilled in the art will readily observe that numerous modifications and alterations of the method may be made while retaining the teachings of the invention. Accordingly, the above disclosure should be construed as limited only by the metes and bounds of the appended claims.

What is claimed is:

1. A method of cleaning a surface of a water in a cleaning chamber, the method comprising the steps of:

providing a cleaning chamber having a wafer to-be-cleaned and an initial pressure therein;

filling the cleaning chamber with a cleaning solution to a sufficient height to immerse the entire wafer under the initial pressure;

decompressing the cleaning chamber in about 2 to 5 seconds to a first pressure that is lower than the initial pressure thereof by a pressure difference that is sufficient to break air bubbles stuck on the surface of the wafer and drive air out of the cleaning solution; and thereafter restoring the pressure in the cleaning chamber to the initial pressure.

2. The method of claim 1, wherein the initial pressure is about 1 atm.

3. The method of claim 1, wherein the first pressure is less than 1 atm.

4. The method of claim 3, wherein the first pressure is in a range from 0.1 atm to 0.5 atm.

5. The method of claim 1, wherein the decompressing step utilizes a vacuum pump to lower the pressure in the cleaning chamber to a sub-atmospheric state of above 0 atm.

6. The method of claim 1, wherein the cleaning solution comprises dilute hydrofluoric acid (DHF).

7. The method of claim 1, wherein the cleaning solution is ultra-pure water (UPW).

8. The method of claim 1, wherein the cleaning solution is RCA Standard Clean 1, SC-1.

9. The method of claim 1, wherein the cleaning solution is RCA Standard Clean 2 (SC-2).

10. The method of claim 1, wherein the cleaning solution is a solution of $O_3$ in water ($O_3/H_2O$).

11. The method of claim 1, wherein the cleaning solution is an $HF/H_2O_2$ solution.

12. The method of claim 1, wherein the cleaning solution is an etching solution for etching the surface of the wafer.

13. The method of claim 12, wherein the etching solution is a buffered oxide etchant (BOE) made of $HF/NH_4F$ solution.

14. The method of claim 12, wherein the etching solution is a hot phosphoric acid solution.

* * * * *